United States Patent
Shiraishi et al.

(10) Patent No.: US 7,750,358 B2
(45) Date of Patent: *Jul. 6, 2010

(54) SEMICONDUCTOR DEVICE AND MANUFACTURING METHOD OF SEMICONDUCTOR DEVICE

(75) Inventors: Akinori Shiraishi, Nagano (JP); Mitsutoshi Higashi, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 180 days.

This patent is subject to a terminal disclaimer.

(21) Appl. No.: 11/598,030

(22) Filed: Nov. 13, 2006

(65) Prior Publication Data

US 2007/0108461 A1 May 17, 2007

(30) Foreign Application Priority Data

Nov. 14, 2005 (JP) ............................ P2005-328786

(51) Int. Cl.
H01L 29/22 (2006.01)

(52) U.S. Cl. .............................. 257/98; 257/81; 257/95; 257/99; 257/100; 257/118; 257/704; 257/E33.061; 257/E33.067; 257/E33.068

(58) Field of Classification Search .................. 257/81, 257/95, 98, 99, 100, 118, 704, E33.061, E33.067, 257/E33.068
See application file for complete search history.

(56) References Cited

U.S. PATENT DOCUMENTS

| 5,909,033 | A | * | 6/1999 | Koga et al. ..................... 257/10 |
| 6,531,328 | B1 | | 3/2003 | Chen ............................ 438/26 |
| 6,881,980 | B1 | * | 4/2005 | Ting ............................ 257/81 |
| 6,936,852 | B2 | * | 8/2005 | Furukawa et al. ............. 257/79 |
| 6,940,218 | B2 | * | 9/2005 | Koga et al. .................. 313/495 |
| 7,279,719 | B2 | * | 10/2007 | Suehiro et al. ................ 257/98 |
| 2001/0000622 | A1 | * | 5/2001 | Reeh et al. .................... 257/98 |
| 2003/0098460 | A1 | | 5/2003 | Yasukawa et al. |
| 2004/0208210 | A1 | | 10/2004 | Inoguchi |
| 2004/0222433 | A1 | | 11/2004 | Mazzochette et al. ......... 257/99 |
| 2005/0161771 | A1 | | 7/2005 | Suchiro et al. .............. 257/612 |
| 2005/0236628 | A1 | | 10/2005 | Matsuura ...................... 257/79 |
| 2006/0102917 | A1 | * | 5/2006 | Oyama et al. ................. 257/99 |
| 2006/0163596 | A1 | * | 7/2006 | Kim et al. ..................... 257/98 |
| 2006/0163601 | A1 | | 7/2006 | Harle et al. ................. 257/100 |
| 2007/0145404 | A1 | | 6/2007 | Murayama et al. |

FOREIGN PATENT DOCUMENTS

| DE | 103 08 866 A1 | 9/2004 |
| JP | 8-122589 | 5/1996 |
| JP | 2001-7346 | 1/2001 |
| JP | 2004-273690 | 9/2004 |

* cited by examiner

*Primary Examiner*—Andy Huynh
(74) *Attorney, Agent, or Firm*—Drinker Biddle & Reath LLP (57) ABSTRACT

A semiconductor device made by mounting a light emitting element in a substrate, characterized in that an optically-transparent cover with a flat plate shape is installed on the light emitting element and a fluorescent substance film is formed on the cover.

19 Claims, 12 Drawing Sheets

SEMICONDUCTOR DEVICE AND MANUFACTURING METHOD OF SEMICONDUCTOR DEVICE

TECHNICAL FIELD

The present disclosure relates to a semiconductor device made by mounting a light emitting element on a substrate, and a manufacturing method of the semiconductor device.

RELATED ART

In a semiconductor device made by mounting a light emitting element on a substrate, various shapes have been proposed but, for example, when the light emitting element is an LED etc., a kind of its light emission color is limited. As a result of that, there are cases of using a fluorescent substance for emitting light corresponding to light emission of the LED and using a mixed color of light emission of a fluorescent substance and light emission of an LED in order to obtain a desired light emission color.

Figure 6:
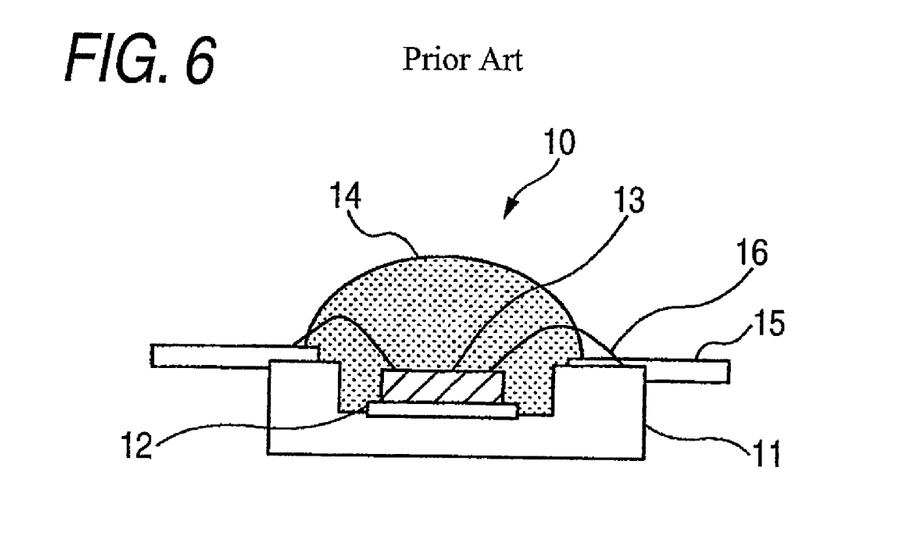
FIG. 6 is a diagram showing a related-art semiconductor device.

FIG. 6 is one example of a configuration of a semiconductor device in which a related-art light emitting element is mounted. Referring to FIG. 6, a semiconductor device 10 has a structure in which a light emitting element 13 made of, for example, an LED is mounted in a recess part of a substrate 11 made of ceramic by an adhesive layer 12.

The light emitting element 13 is connected to wiring 15 formed on the substrate 11 by, for example, a wire 16. Also, a light emission layer 14 made by mixing a fluorescent substance into, for example, a resin material so as to cover the light emitting element 13 is formed so as to swell on the substrate 11.

The semiconductor device 10 has a structure in which light emission of a mixed color of light emission of the fluorescent substance and the light emitting element can be obtained by light emission from the light emission layer (fluorescent substance) 14 and light emission from the light emitting element 13.

[Patent Reference 1] Japanese Patent Unexamined Publication No. Hei. 8-122589

[Patent Reference 2] Japanese Patent Unexamined Publication No. 2004-273690

[Patent Reference 3] Japanese Patent Unexamined Publication No. 2001-7346

However, there were cases where a problem that quality of the semiconductor device deteriorates structurally arises as described below in the case of the structure of the semiconductor device 10.

For example, there was a problem that since the light emitting element 13 is covered with the light emission layer 14, heat dissipation properties are bad and a temperature of the light emission layer or the light emitting element increases. As a result of that, there was a problem that quality of the semiconductor device reduces, for example, light emission efficiency reduces and further a life becomes short.

Also, there was a problem that a fluorescent substance deteriorates by heat generation, or a problem that resin of the light emission layer 14 deteriorates by ultraviolet rays etc. emitted from the light emitting element 13. Also, there was a fear that a fluorescent substance absorbs moisture and thereby quality of the fluorescent substance deteriorates.

Also, in the structure of the light emission layer 14, it is difficult to uniformly apply a fluorescent substance to the light emitting element 13 and there was a fear that variations in intensity or color of light emission occur by variations in film thickness (presence of the fluorescent substance) of the light emission layer.

SUMMARY

Embodiments of the present invention provide a new and useful semiconductor device for solving the problems described above.

Embodiments of the present invention provide a high-quality semiconductor device, in which a light emitting element is mounted, for suppressing variations in light emission while suppressing an influence of reduction in quality by heat generation of the light emitting element.

In the first viewpoint of the one or more embodiments of invention, a semiconductor device comprises a substrate, a light emitting element mounted on the substrate, an optically-transparent cover with a flat plate shape which is installed above the light emitting element, and a fluorescent substance film formed on the cover.

According to the one or more embodiments of the invention, a high-quality semiconductor device, in which a light emitting element is mounted, for suppressing variations in light emission while suppressing an influence of reduction in quality by heat generation of the light emitting element can be provided.

Also, when the light emitting element is made of an LED, heat dissipation of the LED improves and also light emission of a mixed color can be obtained by combination of the LED and a fluorescent substance and this is preferable.

Also, in the case of being a structure in which the light emitting element is sealed by forming a recess part for mounting the light emitting element in the substrate and bonding the periphery of the recess part to the cover, deterioration of quality of the light emitting element can be suppressed by sealing the light emitting element and this is preferable.

Also, when a reflector for reflecting light emission of the light emitting element is installed in space in which the light emitting element is sealed, efficiency of light emission of a semiconductor device improves and this is preferable.

Also, when the cover is bonded to the substrate by anode bonding, the light emitting element can be sealed in a clean state and this is preferable.

Also, in the case of having a structure in which the light emitting element is sealed by bonding a reflector for reflecting light emission of the light emitting element to the cover and the substrate, efficiency of light emission of a semiconductor device improves and also deterioration of quality of the light emitting element can be suppressed and this is preferable.

Also, when the substrate is made of Si, heat dissipation of a light emitting element improves by Si with high thermal conductivity and also it can cope with a fine shape and this is preferable.

Also, in the case of having through wiring which is formed so as to pass through the substrate and is electrically connected to the light emitting element, connection between the light emitting element and a connection target is facilitated.

Also, in the case of having heat dissipation wiring which is formed so as to pass through the substrate and is connected to the reflector, heat dissipation of the reflector improves and this is preferable.

Also, in the second viewpoint of the one or more embodiments of the invention, a manufacturing method of a semiconductor device, comprises steps of mounting a light emitting element on a substrate, installing an optically-transparent cover, which has a flat plate shape and has a fluorescent substance film formed thereon, above the substrate, and sealing the light emitting element using the optically-transparent cover.

According to the one or more embodiments of the invention, a high-quality semiconductor device, in which a light emitting element is mounted, for suppressing variations in light emission while suppressing an influence of reduction in quality by heat generation of the light emitting element can be provided.

According to the one or more embodiments of the invention, a high-quality semiconductor device, in which a light emitting element is mounted, for suppressing variations in light emission while suppressing an influence of reduction in quality by heat generation of the light emitting element can be provided.

Other features and advantages may be apparent from the following detailed description, the accompanying drawings and the claims.

DETAILED DESCRIPTION

Next, embodiments of the invention will be described based on the drawings.

First Embodiment

Figure 1:
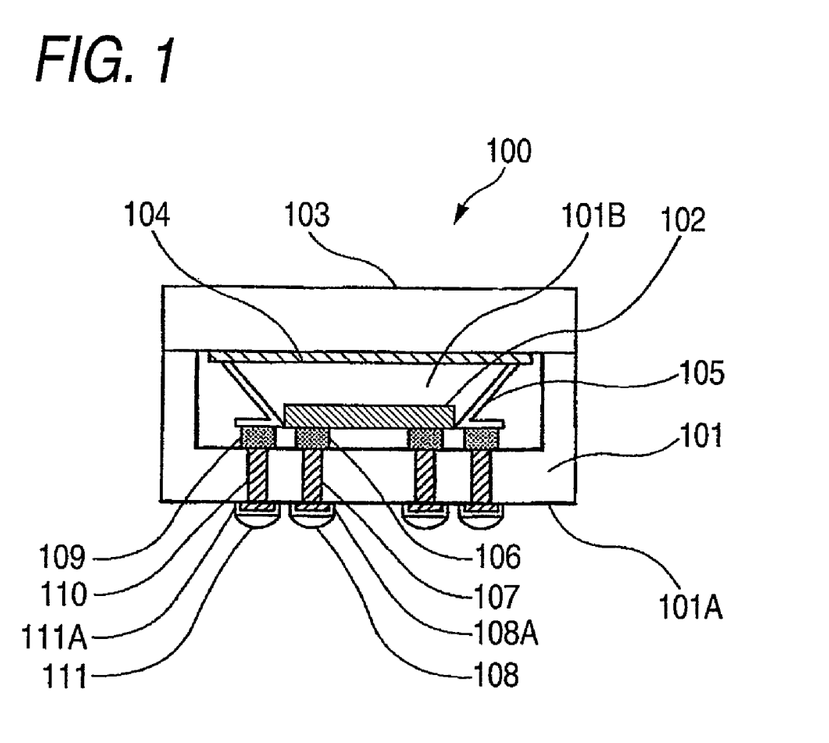
FIG. 1 is a diagram showing a semiconductor device according to a first embodiment.

FIG. 1 is a sectional diagram schematically showing a semiconductor device 100 according to a first embodiment of the invention. Referring to FIG. 1, the semiconductor device 100 is a semiconductor device made by mounting a light emitting element 102 made of, for example, an LED in a substrate 101 made of, for example, Si. Also, an optically-transparent cover 103 with a flat plate shape made of, for example, glass is installed above the light emitting element 102, and a fluorescent substance film 104 is formed on the cover 103.

As a result of this, in the semiconductor device 100 according to the present embodiment, resin etc. including a fluorescent substance or the fluorescent substance film are not applied to the light emitting element (LED) directly, so that heat dissipation of the light emitting element 102 improves and an influence of reduction in quality by heat generation of the light emitting element is suppressed.

Also, an influence in which the fluorescent substance film 104 deteriorates by irradiation etc. with ultraviolet rays or heat dissipation from the light emitting element 102 is suppressed and a life can be prolonged while increasing quality of the semiconductor device.

Also, the semiconductor device 100 according to the embodiment has a feature in which uniformity of a film thickness of the fluorescent substance film is good since the fluorescent substance film is formed on the cover 103 with a substantially flat plate shape by, for example, a printing method. In a related-art semiconductor device, a method for directly applying a fluorescent substance film to a light emitting element was generally used, so that the fluorescent substance film was susceptible to heat dissipation of the light emitting element and also it became difficult to uniformly apply the fluorescent substance film to the light emitting element.

For example, when the fluorescent substance film is directly formed on the light emitting element using a dispenser, there were problems that it is difficult to improve uniformity of the film thickness and also it becomes difficult to form the fluorescent substance film on the side of the light emitting element.

On the other hand, in the semiconductor device according to the embodiment, the fluorescent substance film 104 is formed on the cover 103 with the flat plate shape, so that uniformity of a film thickness of the fluorescent substance film 104 can be formed well using, for example, a printing method. Further, the semiconductor device according to the embodiment has a feature in which uniformity of a light emission color or intensity of light emission is good since it is unnecessary to form the fluorescent substance film on the side of the light emitting element 102.

Also, a recess part 101B for mounting the light emitting element 102 is formed in the substrate 101 and the periphery of the recess part 101B is bonded to the cover 103 and thereby the light emitting element 102 is configured to be sealed on the substrate 101. That is, space in which the light emitting element 102 is sealed is configured to be defined by the substrate 101 and the cover 103. As a result of this, the space in which the light emitting element 102 is sealed can, for example, be set in a low pressure state or be filled with inert gas and life prolongation and maintenance of quality of the light emitting element 102 can be achieved.

Also, when connection between the substrate 101 and the cover 103 is made by anode bonding, space in which the light emitting element is sealed is held clean as compared with the case of being bonded by organic material such as resin, so that quality of the light emitting element 102 improves and this is preferable.

Also, together with the light emitting element 102, a reflector 105 for reflecting light emission from the light emitting element 102 is installed in the space (the recess part 101B) in which the light emitting element 102 is sealed. As a result of this, it is constructed so that light emission efficiency of the semiconductor device 100 according to the embodiment improves.

Also, the light emitting element 102 is installed on a bump (Au bump) 106 made of, for example, Au and the light emitting element 102 is electrically connected to a via plug (through wiring) 107 formed so as to pass through the bottom of the substrate 101 through the bump 106.

A connection layer 108A made of, for example, a Ni/Au plated layer is formed on the side opposite to the side on which the light emitting element 102 is connected to the via plug 107 and further, a solder bump 108 is formed in the connection layer 108A. That is, by forming the via plug 107, the light emitting element 102 can easily be connected to a connection target of the outside of the space in which the light emitting element 102 is sealed. Also, a connection layer made of, for example, a Ni/Au plated layer may be formed between the bump 106 and the via plug 107, but illustration is omitted in the present drawing.

Also, the reflector 105 is connected to a via plug (heat dissipation wiring) 110 passing through the substrate 101, so that heat dissipation properties of the reflector 105 improve. In this case, the via plug 110 is constructed by a structure similar to that of the via plug 107.

For example, the reflector 105 is connected to the via plug 110 formed so as to pass through the bottom of the substrate 101 through a bump (Au bump) 109. A connection layer 111A made of, for example, a Ni/Au plated layer is formed on the side opposite to the side on which the reflector 105 is connected to the via plug 110 and further, a solder bump 111 is formed in the connection layer 111A. In this case, the reflector 105 provides cooling (heat dissipation) through the via plug 110. Also, when the via plug 110 (the solder bump 111) is connected to, for example, a motherboard and is constructed so that heat dissipation properties improve, this is more preferable.

Also, when the substrate 101 is made of, for example, Si, it becomes easy to process the substrate 101 in a fine shape and this is preferable. For example, Si has a feature in which fine processing is easier as compared with material such as ceramic. Also, when the substrate 101 is made of Si, anode bonding can also be performed between the substrate 101 and the cover 103 made of glass (borosilicate glass).

Also, an oxide film (silicon oxide film) 101A is formed on a surface of the substrate 101, and the substrate 101 is insulated from, for example, the via plugs 107, 110 or the bumps 106, 109.

Next, one example of a manufacturing method for manufacturing the semiconductor device 100 will be described by following a procedure based on FIGS. 2A to 2L. However, in the following drawings, the same reference numerals are assigned to the parts described above and the description may be omitted.

Figure 2A:
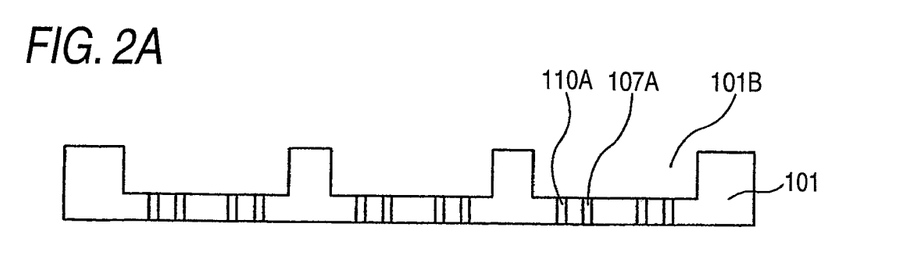
FIG. 2A is a diagram showing a manufacturing method of the semiconductor device of FIG. 1 (first).

First, in a step shown in FIG. 2A, a substrate 101 made of, for example, Si is etched and patterned, and a recess part 101B for installing a light emitting element and via holes 107A, 110A which pass through the substrate 101 and form via plugs 107, 110 are formed.

Figure 2B:
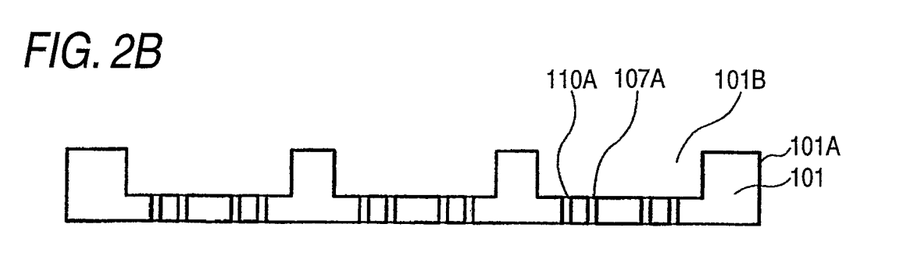
FIG. 2B is a diagram showing a manufacturing method of the semiconductor device of FIG. 1 (second).

Next, in a step shown in FIG. 2B, an oxide film (may be called a silicon oxide film or a thermal oxide film) 101A is formed on a surface of the substrate 101 including an inner wall surface of the recess part 101B or inner wall surfaces of the via holes 107A, 110A by, for example, a thermal CVD method.

Figure 2C:
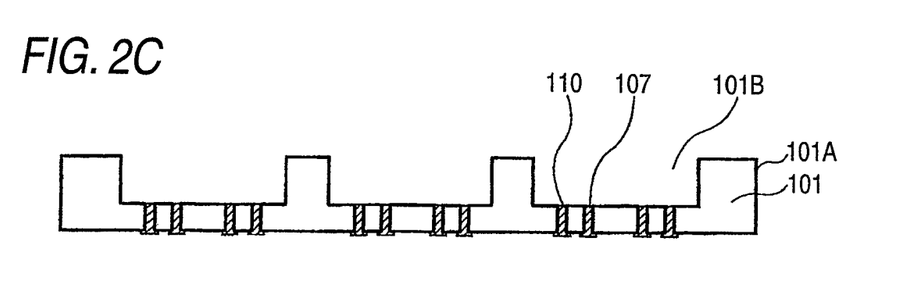
FIG. 2C is a diagram showing a manufacturing method of the semiconductor device of FIG. 1 (third).

Then, in a step shown in FIG. 2C, the via plugs 107, 110 are respectively formed in the via holes 107A, 110A by, for example, a plating method of Cu (for example, a semi-additive method).

Figure 2D:
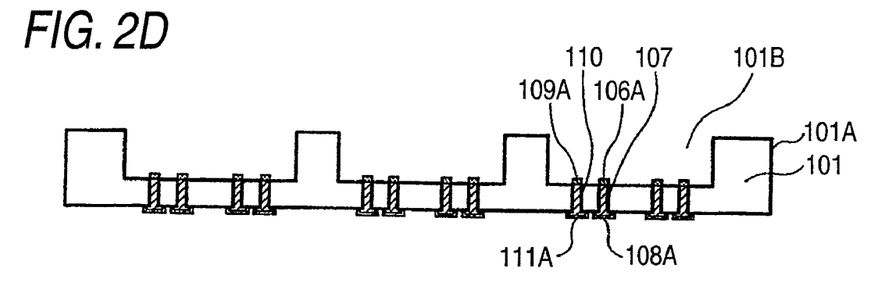
FIG. 2D is a diagram showing a manufacturing method of the semiconductor device of FIG. 1 (fourth).

Then, in a step shown in FIG. 2D, connection layers 106A, 109A, 108A, 111A made of, for example, Ni/Au are formed by, for example, a plating method. In this case, the connection layers 106A, 109A are respectively formed on the side of the recess part 101B of the via plugs 107, 110 and the connection layers 108A, 111A are respectively formed on the side opposite to the recess part 101B of the via plugs 107, 110.

Figure 2E:
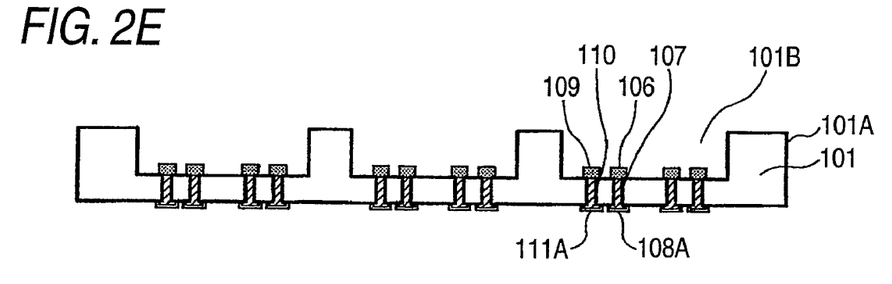
FIG. 2E is a diagram showing a manufacturing method of the semiconductor device of FIG. 1 (fifth).

Then, in a step shown in FIG. 2E, bumps (Au bumps) 106, 109 are respectively formed on the connection layers 106A, 109A. In addition, after the present drawing, illustration of the connection layers 106A, 109A is omitted.

Figure 2F:
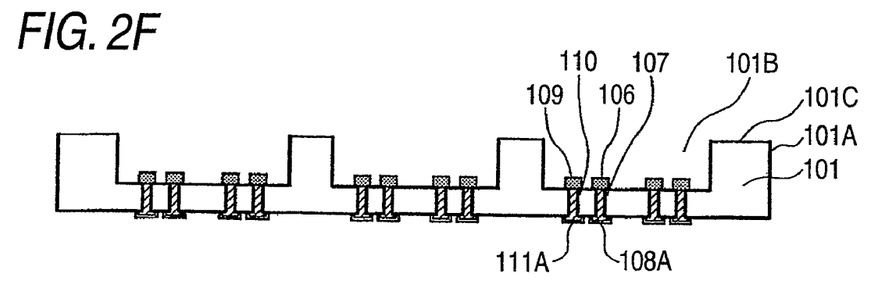
FIG. 2F is a diagram showing a manufacturing method of the semiconductor device of FIG. 1 (sixth).

Then, in a step shown in FIG. 2F, the oxide film 101A of a surface of a protrusion part 101C of the periphery of the recess part 101B is removed by, for example, mask etching. In a subsequent step, a cover made of glass is bonded to the portion in which the oxide film is removed by the present step.

Figure 2G:
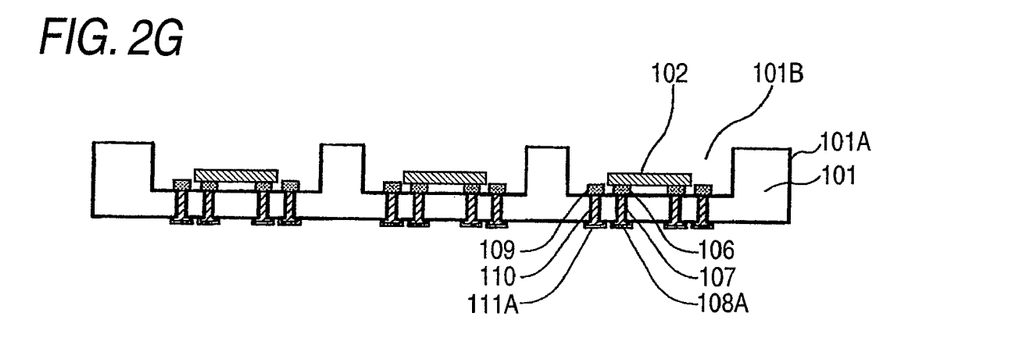
FIG. 2G is a diagram showing a manufacturing method of the semiconductor device of FIG. 1 (seventh).

Then, in a step shown in FIG. 2G, a light emitting element 102 made of, for example, an LED is installed in the recess part 101B. In this case, it is constructed so that the light emitting element 102 is electrically bonded to the bump 106 using, for example, thermal compression bonding or ultrasonic bonding and the light emitting element 102 is electrically connected to the via plug 107 through the bump 106.

Figure 2H:
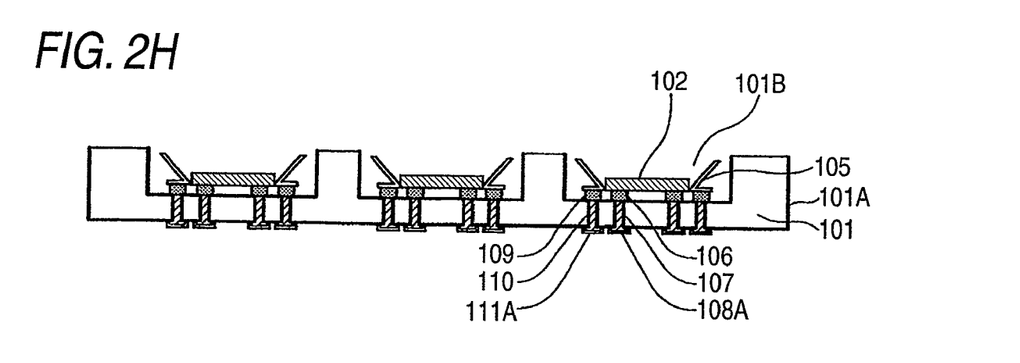
FIG. 2H is a diagram showing a manufacturing method of the semiconductor device of FIG. 1 (eighth).

Then, in a step shown in FIG. 2H, a reflector 105 made by forming a reflective film of Ag or Al on a surface of alloy of, for example, Fe, Ni or Co is installed in the recess part 101B. In this case, it is constructed so that the reflector 105 is bonded to the bump 109 using, for example, thermal compression bonding or ultrasonic bonding and the reflector 105 is connected to the via plug 110 through the bump 109.

Figure 2I:
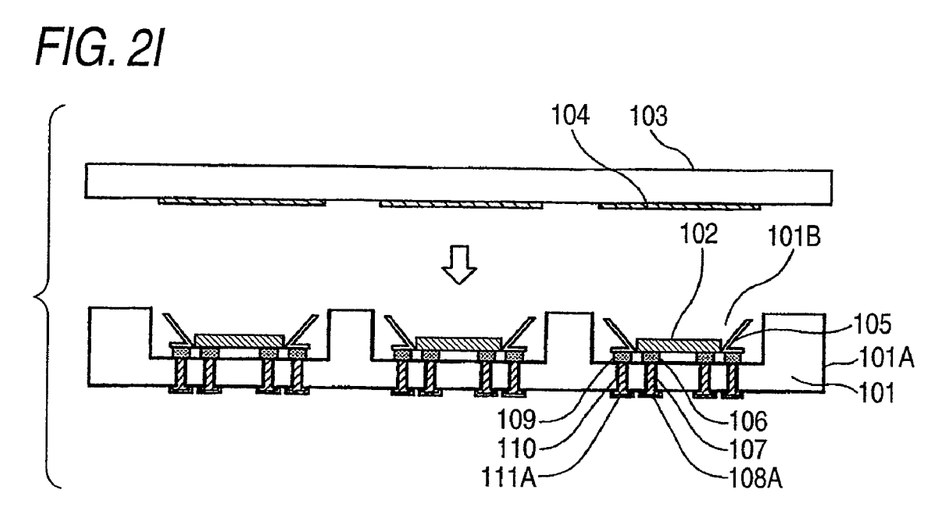
FIG. 2I is a diagram showing a manufacturing method of the semiconductor device of FIG. 1 (ninth).

Then, in a step shown in FIG. 2I, a fluorescent substance film 104 is patterned and formed on a cover 103 with a flat plate shape made of, for example, borosilicate glass by, for example, a printing method. In the manufacturing method of the semiconductor device according to the embodiment, the fluorescent substance film 104 is formed on the cover 103 with the flat plate shape as described above, so that uniformity of a film thickness of the fluorescent substance film 104 can be formed well using, for example, a printing method. As a result of that, uniformity of a light emission color or intensity of light emission of the semiconductor device can be improved.

Also in this case, it is preferable to pattern the fluorescent substance film so that the cover 103 makes direct contact with the substrate 101 without forming the fluorescent substance film 104 on the portion in which the cover 103 is bonded to the substrate 101.

Figure 2J:
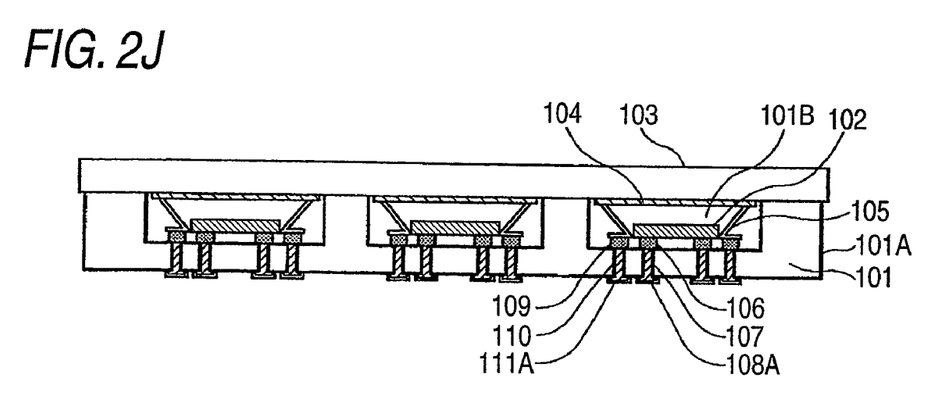
FIG. 2J is a diagram showing a manufacturing method of the semiconductor device of FIG. 1 (tenth).

Then, in a step shown in FIG. 2J, the cover 103 is bonded to the substrate 101 by, for example, anode bonding and a structure in which the light emitting element 102 is sealed on the substrate 101 is formed. In this case, the anode bonding is performed by applying a high voltage between the cover 103 and the substrate 101 and increasing temperature of the cover 103 and the substrate 101.

When the anode bonding is performed, Si constructing the substrate is coupled to oxygen in glass constructing the cover and bonding with good and stable bonding force is performed. Also, the feature is that impurities or gas, etc. contaminating space in which the light emitting element is sealed rarely occur unlike bonding using resin material.

Figure 2K:
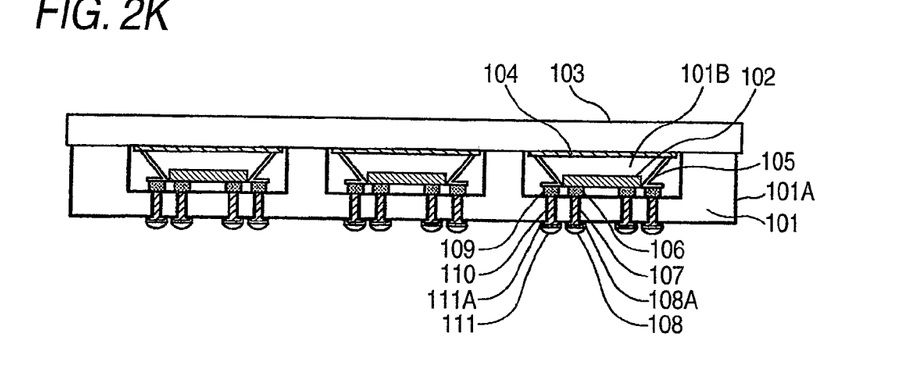
FIG. 2K is a diagram showing a manufacturing method of the semiconductor device of FIG. 1 (eleventh).

Then, in a step shown in FIG. 2K, solder bumps 108, 111 are respectively formed in the connection layers 108A, 111A.

Figure 2L:
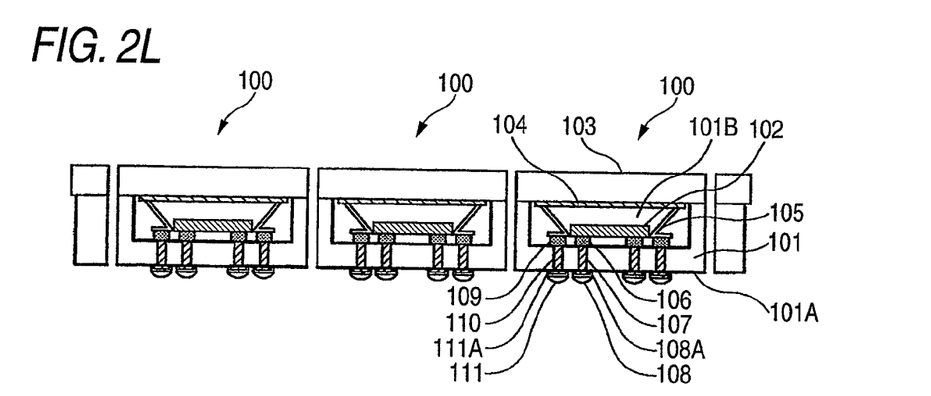
FIG. 2L is a diagram showing a manufacturing method of the semiconductor device of FIG. 1 (twelfth).

Then, in a step shown in FIG. 2L, the substrate 101 and the cover 103 are cut by dicing and are divided into individual pieces and thereby the semiconductor device 100 described previously can be formed.

Second Embodiment

Also, the semiconductor device according to the invention is not limited to the structure described in the first embodiment and, for example, can be constructed variously as described below.

Figure 3:
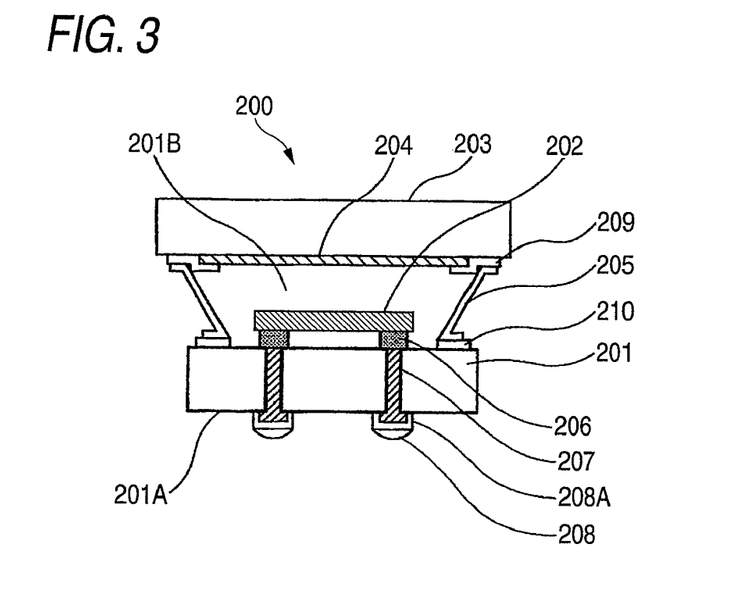
FIG. 3 is a diagram showing a semiconductor device according to a second embodiment.

FIG. 3 is a sectional diagram schematically showing a semiconductor device 200 according to a second embodiment of the invention. Referring to FIG. 3, the semiconductor device 200 is a semiconductor device made by mounting a light emitting element 202 made of, for example, an LED on a substrate 201 made of, for example, Si. Also, an optically-transparent cover 203 with a flat plate shape made of, for example, glass is installed above the light emitting element 202, and a fluorescent substance film 204 is formed on the cover 203.

In this case, the substrate 201, the light emitting element 202, the cover 203 and the fluorescent substance film 204 according to the present embodiment correspond to the substrate 101, the light emitting element 102, the cover 103 and the fluorescent substance film 104 of the case of the first embodiment, and the semiconductor device 200 according to the embodiment has an effect similar to that of the semiconductor device 100.

That is, in the semiconductor device 200, resin etc. including a fluorescent substance or the fluorescent substance film are not applied to the light emitting element (LED) directly, so that heat dissipation of the light emitting element 202 improves and an influence of reduction in quality by heat generation of the light emitting element is suppressed.

Also, an influence in which the fluorescent substance film 204 deteriorates by irradiation etc. with ultraviolet rays or heat dissipation from the light emitting element 202 is suppressed and a life can be prolonged while increasing quality of the semiconductor device.

Also, the semiconductor device 200 according to the embodiment has a feature in which uniformity of a film thickness of the fluorescent substance film is good since the fluorescent substance film is formed on the cover 203 with a substantially flat plate shape by, for example, a printing method. That is, in the semiconductor device according to the embodiment, the fluorescent substance film 204 is formed on the cover 203 with the flat plate shape, so that uniformity of a film thickness of the fluorescent substance film 204 can be formed well using, for example, a printing method. Further, the semiconductor device according to the embodiment has a feature in which uniformity of a light emission color or intensity of light emission is good since it is unnecessary to form the fluorescent substance film on the side of the light emitting element 202.

Also, the light emitting element 202 is installed on a bump (Au bump) 206 made of, for example, Au and the light emitting element 202 is electrically connected to a via plug (through wiring) 207 formed so as to pass through the bottom of the substrate 201 through the bump 206.

A connection layer 208A made of, for example, a Ni/Au plated layer is formed on the side opposite to the side on which the light emitting element 202 is connected to the via plug 207 and further, a solder bump 208 is formed in the connection layer 208A. That is, by forming the via plug 207, the light emitting element 202 can easily be connected to a connection target of the outside of space in which the light emitting element 202 is sealed. Also, a connection layer made of, for example, a Ni/Au plated layer may be formed between the bump 206 and the via plug 207, but illustration is omitted in the present drawing.

Also, an oxide film (silicon oxide film) 201A is formed on a surface of the substrate 201, and the substrate 201 is insulated from, for example, the via plug 207 or the bump 206.

The semiconductor device 200 according to the embodiment differs from the semiconductor device 100 of the first embodiment in the following points and has an effect peculiar to the present embodiment.

The semiconductor device 200 according to the embodiment has a reflector 205 (corresponding to the reflector 105) for reflecting light emission from the light emitting element 202 and also, the reflector 205 defines seal space 201B for sealing the light emitting element 202 together with the substrate 201 and the cover 203.

In this case, one end of the reflector 205 is bonded to the substrate 201 by a bonding layer 210 made of, for example, Au formed on the substrate 201. Also, the other end of the reflector 205 is bonded to the cover 203 by a bonding layer 209 made of, for example, Au. That is, the reflector 205 is bonded to both of the substrate 201 and the cover 203 and thereby the seal space 201B in which the light emitting element 202 is sealed is formed.

As a result of this, the seal space 201B can, for example, be set in a low pressure state or be filled with inert gas and life prolongation and maintenance of quality of the light emitting element 202 can be achieved.

Also, it may be constructed by a structure (structure similar to the first embodiment) in which heat dissipation properties of the reflector 205 improve by forming heat dissipation wiring corresponding to the via plug 110 described in the first embodiment in the substrate 201 and connecting the wiring to the reflector 205.

The semiconductor device 200 according to the embodiment has a feature in which a structure (shape) of the substrate 201 is simpler than that of the substrate 101 and processing of the substrate 201 is facilitated. Also, since the reflector is configured to be exposed to the outside air, there is a merit in which heat dissipation properties are better than those of the semiconductor device 100.

Next, one example of a manufacturing method for manufacturing the semiconductor device 200 will be described by following a procedure based on FIGS. 5A to 5M. However, in the following drawings, the same reference numerals are assigned to the parts described above and the description may be omitted.

Figure 4A:
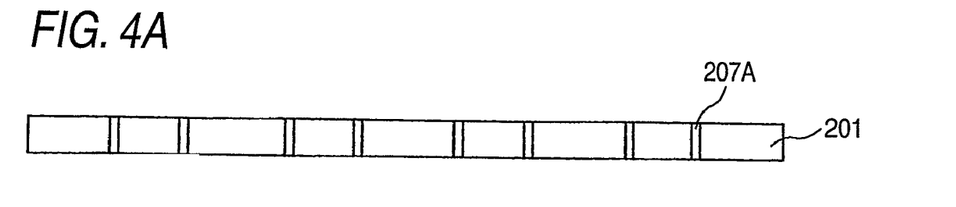
FIG. 4A is a diagram showing a manufacturing method of the semiconductor device of FIG. 3 (first).

First, in a step shown in FIG. 4A, a substrate 201 made of, for example, Si is etched and patterned, and a via hole 207A which passes through the substrate 201 and form a via plug 207 is formed.

Figure 4B:
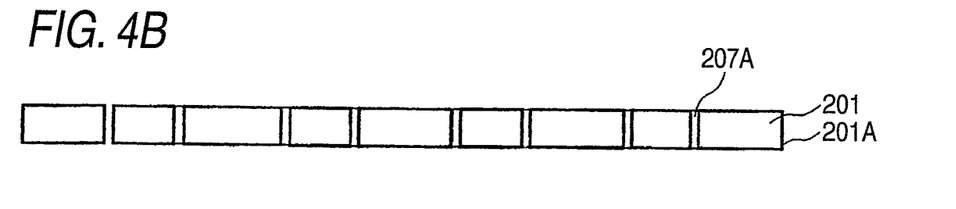
FIG. 4B is a diagram showing a manufacturing method of the semiconductor device of FIG. 3 (second).

Next, in a step shown in FIG. 4B, an oxide film (may be called a silicon oxide film or a thermal oxide film) 201A is formed on a surface of the substrate 201 including an inner wall surface of the via hole 207A by, for example, a thermal CVD method.

Figure 4C:
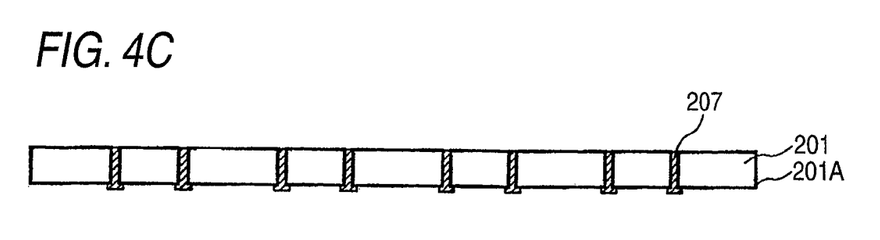
FIG. 4C is a diagram showing a manufacturing method of the semiconductor device of FIG. 3 (third).

Then, in a step shown in FIG. 4C, the via plug 207 is formed in the via hole 207A by, for example, a plating method of Cu (for example, a semi-additive method).

Figure 4D:
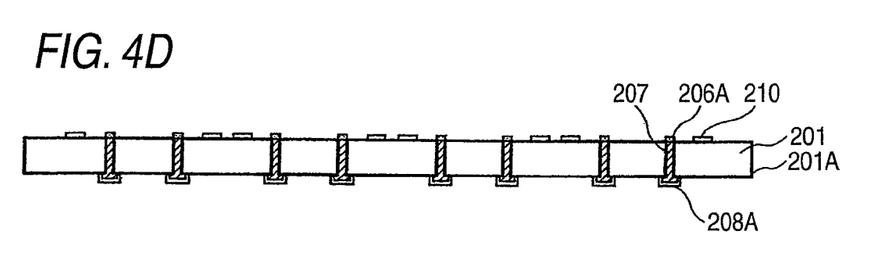
FIG. 4D is a diagram showing a manufacturing method of the semiconductor device of FIG. 3 (fourth).

Then, in a step shown in FIG. 4D, connection layers 206A, 208A made of, for example, Ni/Au are formed with respect to the via plug 207 by, for example, a plating method. In this case, with respect to the via plug 207, the connection layer 206A is formed on a first side on which a light emitting element is mounted in a subsequent step and the connection layer 208A is formed on a second side opposite to the first side. Also, a bonding layer 210 made of, for example, Au for bonding a reflector in a subsequent step is formed on the first side of the substrate 201 by a sputtering method or a plating method, etc. In addition, after the present drawing, illustration of the connection layers 206A, 208A is omitted.

Figure 4E:
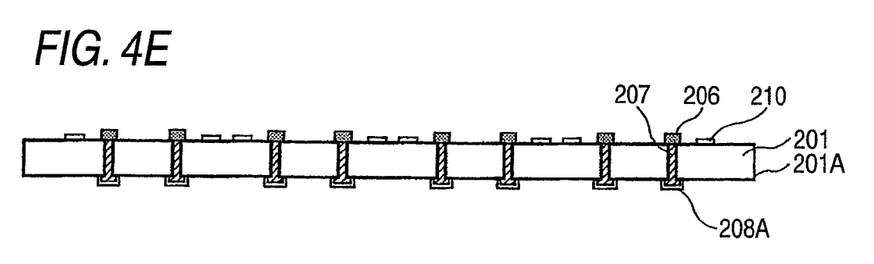
FIG. 4E is a diagram showing a manufacturing method of the semiconductor device of FIG. 3 (fifth).

Then, in a step shown in FIG. 4E, a bump (Au bump) 206 is formed on the connection layer 206A.

Figure 4F:
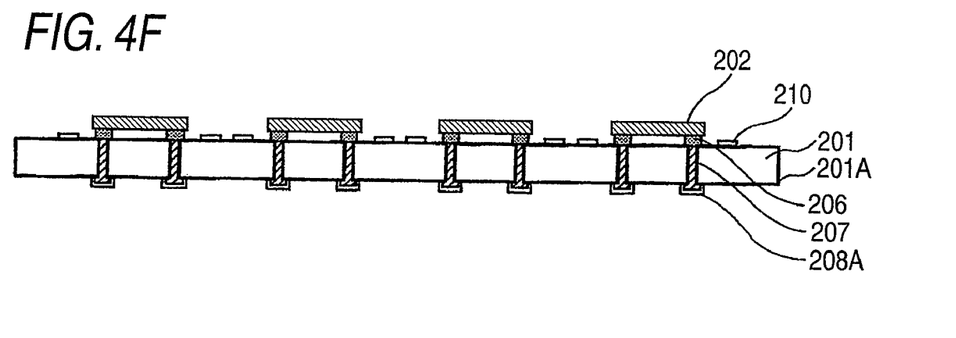
FIG. 4F is a diagram showing a manufacturing method of the semiconductor device of FIG. 3 (sixth).

Then, in a step shown in FIG. 4F, a light emitting element 202 made of, for example, an LED is installed in the substrate 201. In this case, it is constructed so that the light emitting element 202 is electrically bonded to the bump 206 using, for example, thermal compression bonding or ultrasonic bonding and the light emitting element 202 is electrically connected to the via plug 207 through the bump 206.

Figure 4G:
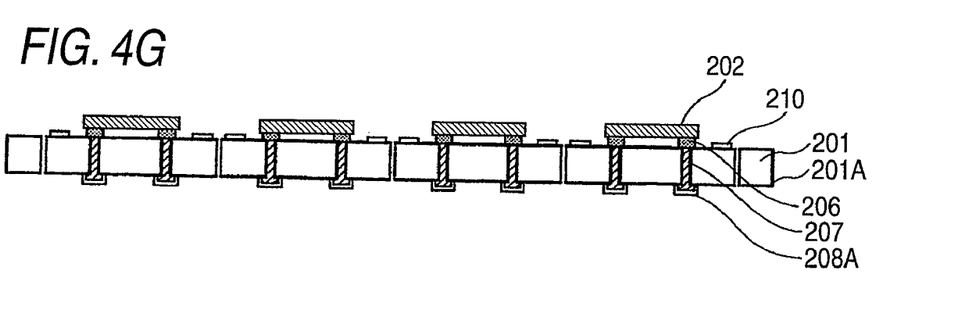
FIG. 4G is a diagram showing a manufacturing method of the semiconductor device of FIG. 3 (seventh).

Then, in a step shown in FIG. 4G, the substrate 201 is cut by dicing and the substrate 201 in which the light emitting element 202 is mounted is divided into individual pieces.

Figure 4H:
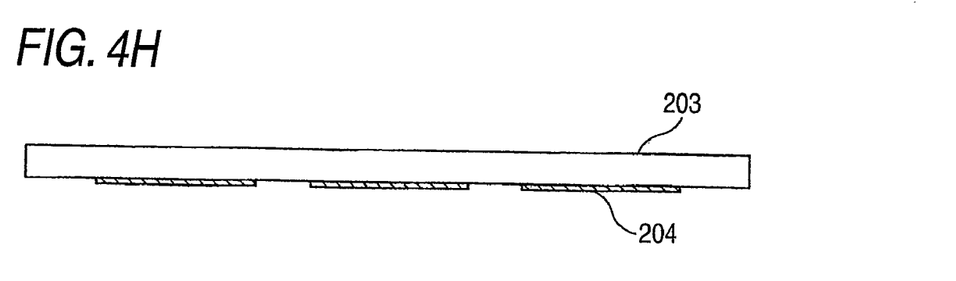
FIG. 4H is a diagram showing a manufacturing method of the semiconductor device of FIG. 3 (eighth).

Then, in a step shown in FIG. 4H, a fluorescent substance film 204 is patterned and formed on a cover 203 with a flat plate shape made of, for example, borosilicate glass by, for example, a printing method. In the manufacturing method of the semiconductor device according to the embodiment, the fluorescent substance film 204 is formed on the cover 203 with the flat plate shape as described above, so that uniformity of a film thickness of the fluorescent substance film 204 can be formed well using, for example, a printing method. As a result of that, uniformity of a light emission color or intensity of light emission of the semiconductor device can be improved.

Figure 4I:
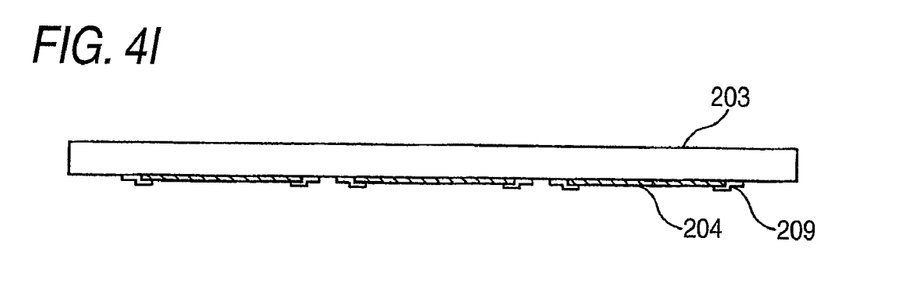
FIG. 4I is a diagram showing a manufacturing method of the semiconductor device of FIG. 3 (ninth).

Then, in a step shown in FIG. 4I, a bonding layer 209 made of, for example, Au for bonding a reflector 205 in a subsequent step is formed on the cover 203 by, for example, a sputtering method.

Figure 4J:
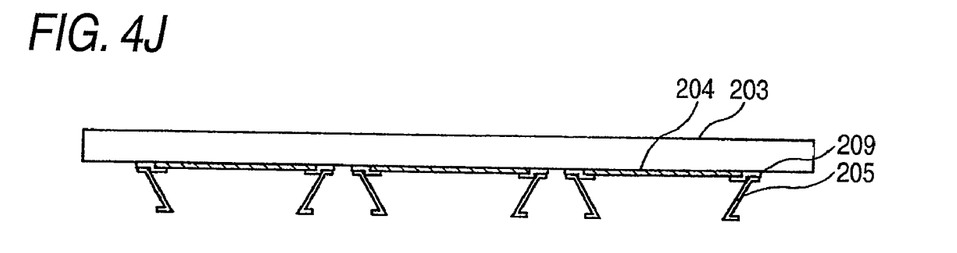
FIG. 4J is a diagram showing a manufacturing method of the semiconductor device of FIG. 3 (tenth).

Then, in a step shown in FIG. 4J, the reflector 205 made by forming a reflective film of Ag or Al on a surface of alloy of, for example, Fe, Ni or Co is bonded to the bonding layer 209. In this case, the reflector 205 is bonded to the bonding layer 209 using, for example, thermal compression bonding or ultrasonic bonding.

Figure 4K:
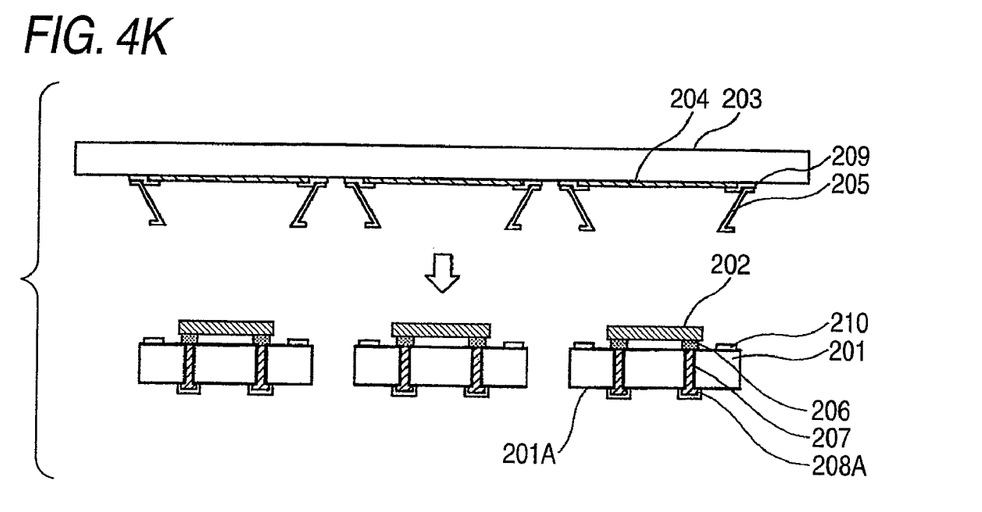
FIG. 4K is a diagram showing a manufacturing method of the semiconductor device of FIG. 3 (eleventh).

Then, in a step shown in FIG. 4K, the reflector 205 bonded to the cover 203 is bonded to the substrate 201 in which the light emitting element 202 is mounted. In this case, the reflector 205 is bonded to the bonding layer 210 using, for example, thermal compression bonding or ultrasonic bonding. In this manner, seal space 201B in which the light emitting element 202 is sealed is formed, and the light emitting element 202 is sealed on the substrate 201.

Figure 4L:
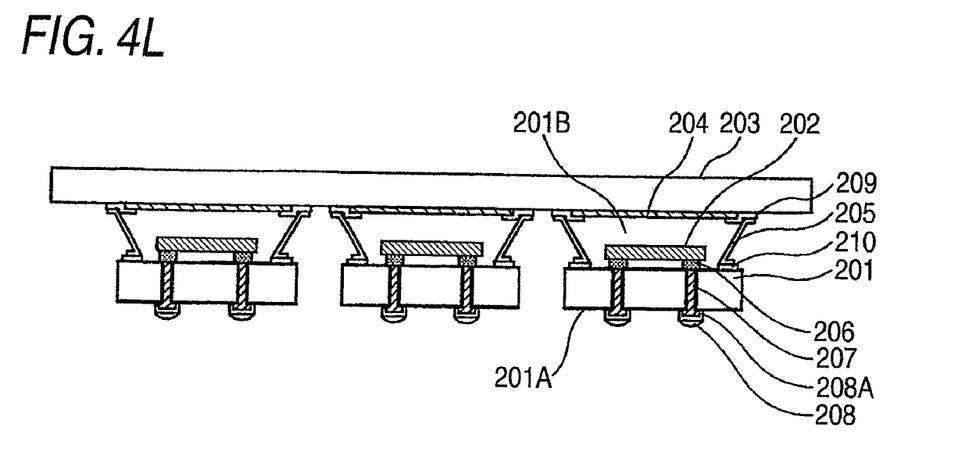
FIG. 4L is a diagram showing a manufacturing method of the semiconductor device of FIG. 3 (twelfth).

Then, in a step shown in FIG. 4L, a solder bump 208 is formed in the connection layer 208A.

Figure 4M:
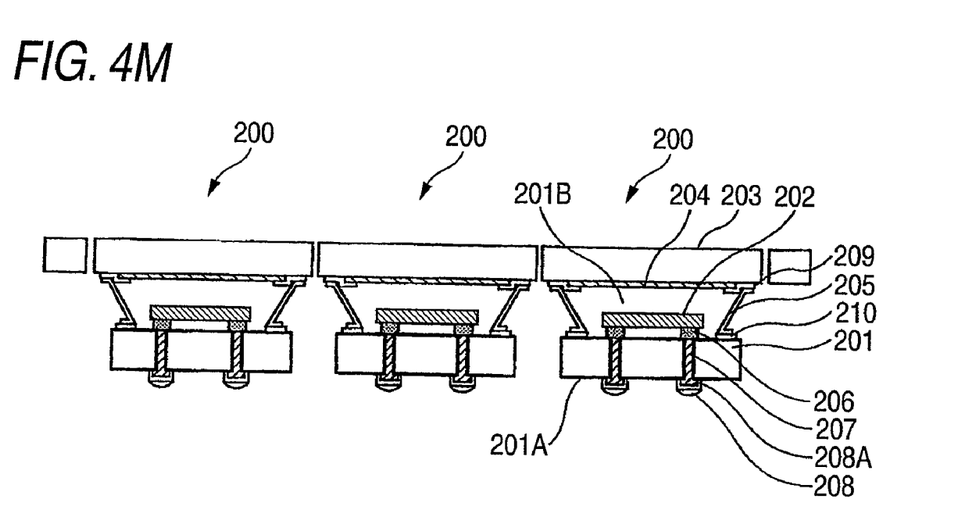
FIG. 4M is a diagram showing a manufacturing method of the semiconductor device of FIG. 3 (thirteenth).

Then, in a step shown in FIG. 4M, the cover 203 is cut by dicing and is divided into individual pieces and thereby the semiconductor device 200 described previously can be formed.

In the semiconductor device 200 manufactured by the embodiment, a structure (shape) of the substrate 201 is simpler than that of the substrate 101 and also the reflector is configured to be exposed to the outside air, so that the semiconductor device 200 has a feature in which heat dissipation properties are better than those of the semiconductor device 100.

Also, in the embodiments described above, the case where the light emitting element is mainly an LED has been described as an example, but it is not limited to this case and it is apparent that the invention can also be applied to other light emitting elements. Also, the invention can be applied by replacing the light emitting element with a light receiving element and in this case, a film formed on the covers 103, 203 can be used as, for example, a filter.

Figure 5:
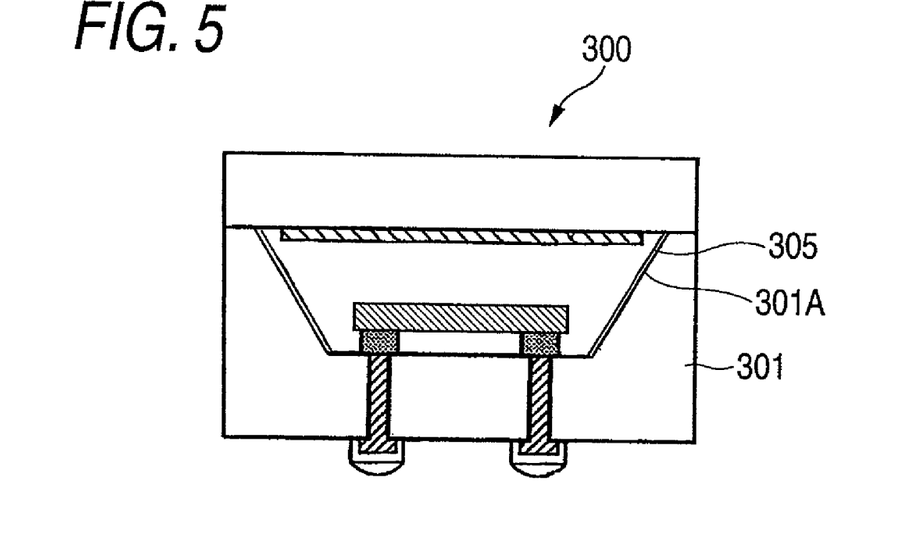
FIG. 5 is a diagram showing a semiconductor device according to a modified example of the first embodiment.

Further, the invention can be applied to a semiconductor device 300 in which as shown in FIG. 5, instead of the reflector, a Si substrate 301 has a recess part with a tapered section 301A and a reflective film 305 is formed on an inner side surface of the recess part of the substrate 301.

As described above, the invention has been described based on the preferred embodiments, but the invention is not limited to the specific embodiments, and various modifications and changes can be made within the gist described in the claims.

According to the invention, a high-quality semiconductor device, in which a light emitting element is mounted, for suppressing variations in light emission while suppressing an influence of reduction in quality by heat generation of the light emitting element can be provided.

What is claimed is:

1. A semiconductor device comprising:
   a substrate having a recess part, the recess part having a periphery and a floor;
   a light emitting element mounted within the recess part on the floor;
   an optically-transparent cover with a flat plate shape made of electrically insulative material which is installed above the light emitting element; and
   a fluorescent substance film formed on only a portion of the optically-transparent cover, the periphery of the recess part being directly bonded to a portion of the optically-transparent cover other than the portion on which the fluorescent substance film is formed.

2. A semiconductor device as claimed in claim 1, wherein the light emitting element comprises an LED.

3. A semiconductor device as claimed in claim 1, wherein the bonding of the periphery of the recess part to the portion of the cover other than the portion on which the fluorescent substance film is formed is configured such that the light emitting element is sealed within the substrate and the cover.

4. A semiconductor device as claimed in claim 3, further comprising:
   a reflector for reflecting light emission of the light emitting element, which is installed in space in which the light emitting element is sealed.

5. A semiconductor device as claimed in claim 3, wherein the periphery of the recess part is anode-bonded to the portion of the cover other than the portion on which the fluorescent substance film is formed.

6. A semiconductor device as claimed in claim 1, further comprising:
a reflector for reflecting light emission of the light emitting element,
wherein the light emitting element is sealed by bonding the reflector to the cover and the substrate.

7. A semiconductor device as claimed in claim 1, wherein the substrate is made of Si.

8. A semiconductor device as claimed in claim 1, further comprising:
a through wiring which passes through the substrate and is electrically connected to the light emitting element.

9. A semiconductor device as claimed in claim 4, further comprising:
a heat dissipation wiring which is formed so as to pass through the substrate and is connected to the reflector.

10. A manufacturing method of a semiconductor device, comprising:
mounting a light emitting element on a substrate within a recess part of the substrate, the recess part of the substrate having a periphery and a floor, with the light emitting element being mounted on the floor;
installing an optically-transparent cover made of electrically insulative material, which has a flat plate shape and a fluorescent substance film formed on only a portion of the optically-transparent cover, above the substrate; and
sealing the light emitting element using the optically-transparent cover by directly bonding the periphery of the recess part and the portion of the optically-transparent cover other than the portion on which the fluorescent substance film is formed.

11. A semiconductor device as claimed in claim 8, further comprising:
a bump on which the light emitting element is installed so that the light emitting element is electrically connected to the through wiring which is formed so as to pass through a bottom portion of the substrate through the bump.

12. A manufacturing method of a semiconductor device as claimed in claim 10, wherein the mounting of the light emitting element comprises mounting an LED on the substrate.

13. A manufacturing method of a semiconductor device as claimed in claim 10, wherein the bonding of the periphery of the recess part and the portion of the cover other than the portion on which the fluorescent substance film is formed comprises anode bonding.

14. A manufacturing method of a semiconductor device as claimed in claim 13, further comprising:
installing a reflector for reflecting light emission of the light emitting element in the recess part in which the light emitting element is sealed.

15. The manufacturing method of a semiconductor device as claimed in claim 10, wherein the substrate is made of Si.

16. A manufacturing method of a semiconductor device as claimed in claim 10, wherein the substrate comprises Si, the cover comprises glass, and the bonding of the portion of the cover other than the portion on which the substance film is formed with the periphery of the recess part of the substrate comprises anode bonding the Si and the glass.

17. A manufacturing method of a semiconductor device as claimed in claim 10, further comprising:
forming a through wiring so as to pass through a floor of the substrate and so as to be electrically connected to the light emitting element.

18. A semiconductor device as claimed in claim 1, wherein the periphery of the recess part directly contacts the portion of the optically-transparent cover such that the direct bonding creates a seal at the contact between the periphery of the recess part and the portion of the optically-transparent cover to define a sealed space in which the light emitting element is disposed.

19. A manufacturing method of a semiconductor device as claimed in claim 10, wherein in the direct bonding the periphery of the recess part directly contacts the portion of the optically-transparent cover such that the direct bonding creates a seal at the contact between the periphery of the recess part and the portion of the optically-transparent cover to define a sealed space in which the light emitting element is disposed.

* * * * *